United States Patent
Lacap et al.

(10) Patent No.: US 6,937,060 B2
(45) Date of Patent: Aug. 30, 2005

(54) METHOD AND APPARATUS FOR IMPLEMENTING POWER CONTROL IN MULTI-VOLTAGE I/O CIRCUITS

(75) Inventors: Daniel Bravo Lacap, Rochester, MN (US); John Steven Mitby, Rochester, MN (US); David W. Siljenberg, Byron, MN (US); Daniel Guy Young, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 39 days.

(21) Appl. No.: 10/760,430

(22) Filed: Jan. 20, 2004

(65) Prior Publication Data

US 2005/0156623 A1 Jul. 21, 2005

(51) Int. Cl.[7] .......................................... H03K 19/003
(52) U.S. Cl. ............................ 326/33; 326/34; 326/82
(58) Field of Search ............................... 326/31, 33, 34, 326/80, 82, 83; 327/108, 112, 538, 539

(56) References Cited

U.S. PATENT DOCUMENTS 5,635,869 A * 6/1997 Ferraiolo et al. ........... 327/543
6,448,809 B2 * 9/2002 Goetting et al. .............. 326/44

* cited by examiner

Primary Examiner—Anh Q. Tran
(74) Attorney, Agent, or Firm—Joan Pennington

(57) ABSTRACT

A method and apparatus are provided for implementing power control in multi-voltage input/output (I/O) circuits. First current biasing devices are provided for creating a first constant bias current. Second current biasing devices are provided for creating a second bias current. The second current biasing devices are activated at a first voltage and are deactivated at a second voltage. The first voltage is less than the second voltage.

15 Claims, 3 Drawing Sheets

US 6,937,060 B2

METHOD AND APPARATUS FOR IMPLEMENTING POWER CONTROL IN MULTI-VOLTAGE I/O CIRCUITS

FIELD OF THE INVENTION

The present invention relates generally to the data processing field, and more particularly, relates to a method and apparatus for implementing power control in multi-voltage input/output (I/O) circuits.

DESCRIPTION OF THE RELATED ART

As technologies evolve, power supply voltages are being reduced and I/O performance requirements are increasing. In addition, I/O circuits are often required to support more than one generation of technologies and this requires the I/O circuits to operate over an increasing range of power supply voltages.

High performance differential receivers in these I/O circuits generally require a DC bias current. This DC bias current can result in excessive power dissipation when circuits are designed to meet performance at lower voltages and then are operated at higher voltages. Regulators or dropping resistors are either expensive or performance limiting.

A need exists for a mechanism for implementing power control in multi-voltage input/output (I/O) circuits. It is desirable to provide such a mechanism for implementing power control in multi-voltage input/output (I/O) circuits that is simple to implement and generally effective without limiting performance.

SUMMARY OF THE INVENTION

Principal aspects of the present invention are to provide a method and apparatus for implementing power control in multi-voltage input/output (I/O) circuits. Other important aspects of the present invention are to provide such method and apparatus for implementing power control in multi-voltage input/output (I/O) circuits substantially without negative effect and that overcome many of the disadvantages of prior art arrangements.

In brief, a method and apparatus are provided for implementing power control in multi-voltage input/output (I/O) circuits. First current biasing devices are provided for creating a first constant bias current. Second current biasing devices are provided for creating a second bias current. The second current biasing devices are activated at a first voltage and are deactivated at a second voltage. The first voltage is less than the second voltage.

In accordance with features of the invention, apparatus for implementing power control in multi-voltage input/output (I/O) circuits includes a first set of current biasing devices and a second set of current biasing devices. The first set of current biasing devices is always on and the second set of current biasing devices is only activated to create a second bias current at a lower power supply voltage to maintain performance.

In accordance with features of the invention, each of the first set of current biasing devices and the second set of current biasing devices include a plurality of field effect transistors that are arranged in parallel. A gate input to the second set of current biasing field effect transistors (FETs) activates the FETs at the lower power supply voltage and deactivates the FETs at a higher power supply voltage.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In accordance with features of the invention, a first set of current biasing devices is constantly activated, and a second set of current biasing devices is activated at lower voltage applications to maintain a desired current.

Figure 1:
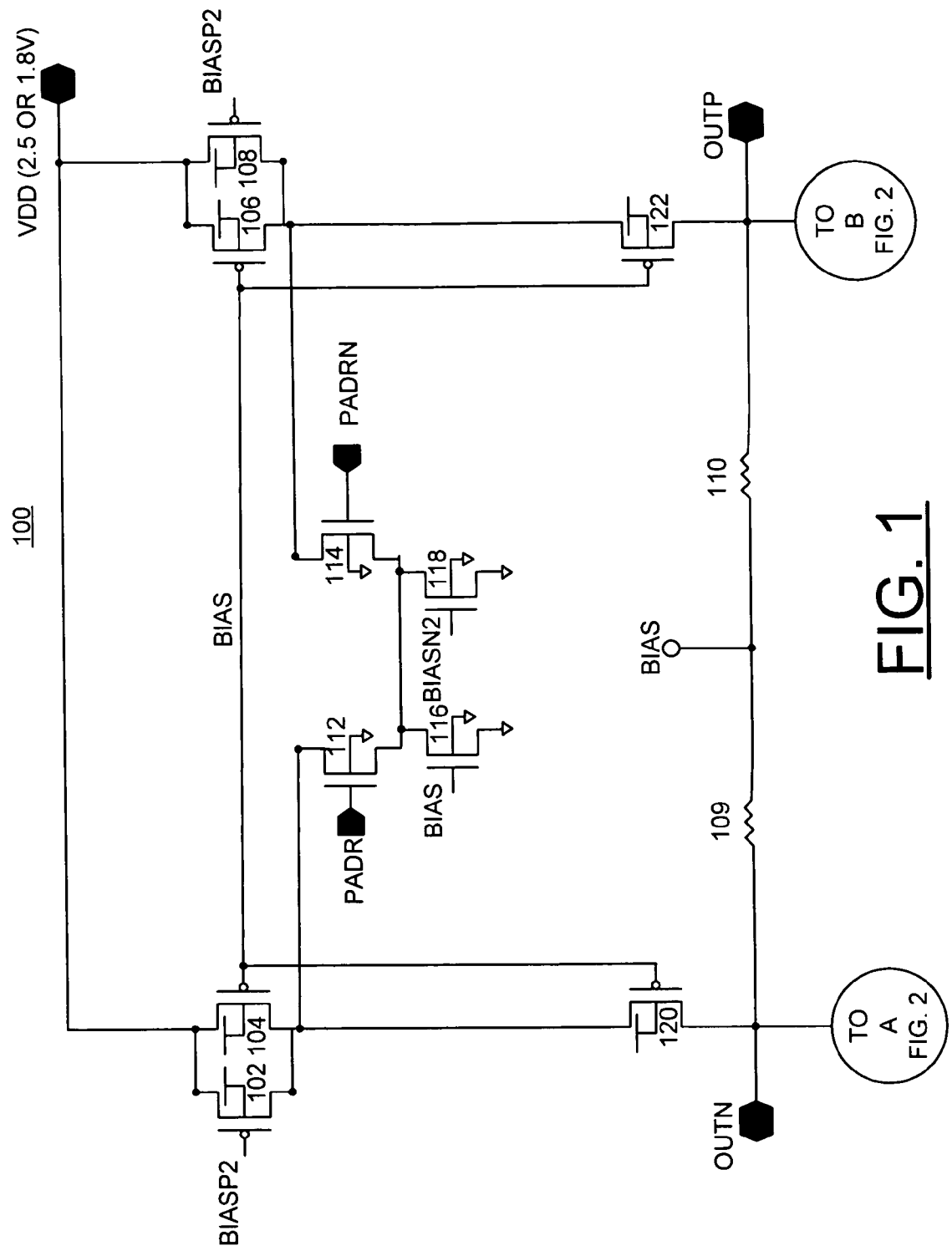
FIGS. 1 and 2 together provide a schematic diagram of an exemplary I/O circuit for implementing power control for multi-voltage applications in accordance with the preferred embodiment.
Figure 2:
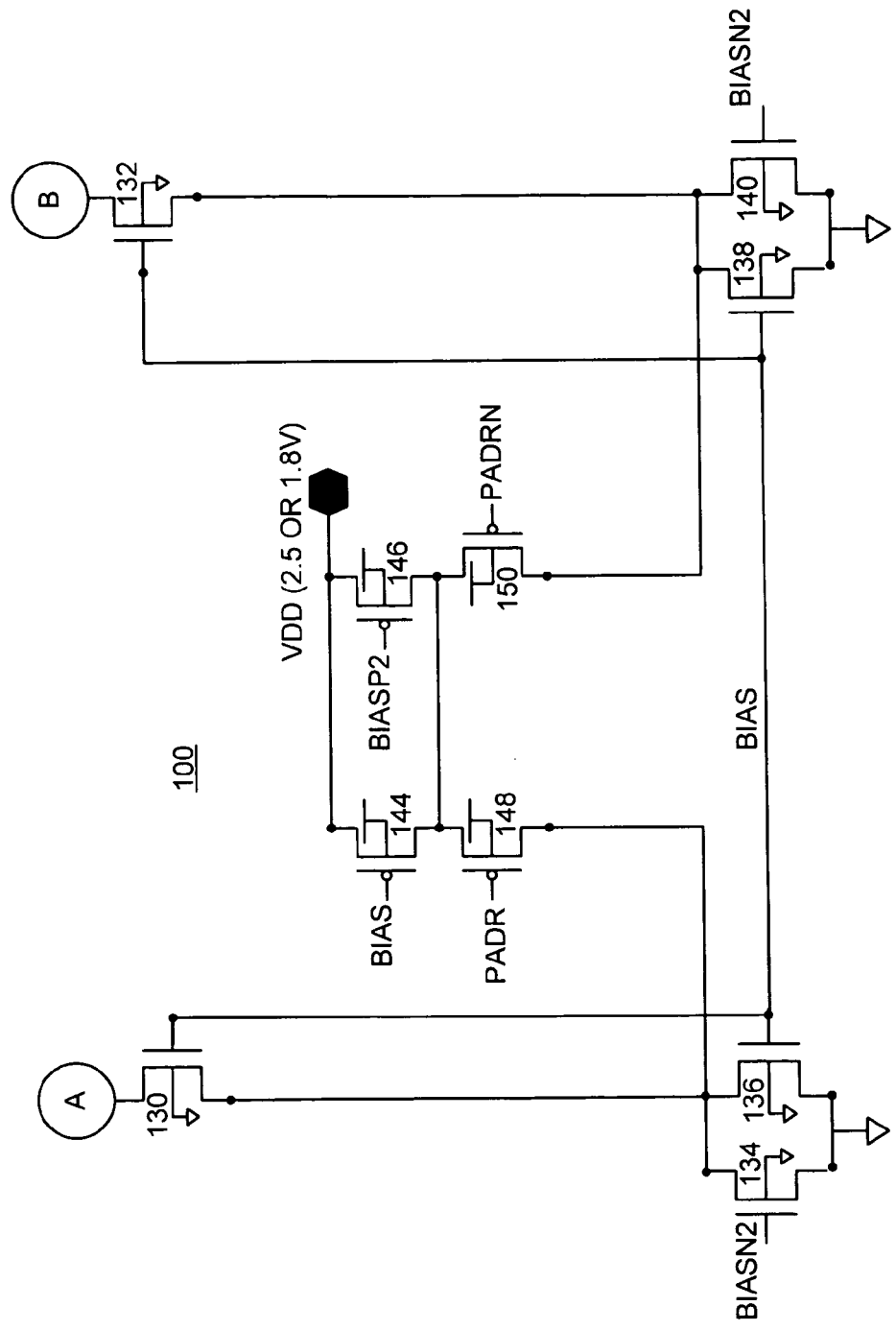

Having reference now to the drawings, in FIGS. 1 and 2 there is shown an exemplary I/O circuit for implementing power control for multi-voltage applications in accordance with the preferred embodiment generally designated by the reference character 100. I/O circuit 100 can be operated at a selected or variable voltage rail labeled VDD, for example, at 2.5 volts or 1.8 volts.

Referring now to FIG. 1, I/O circuit 100 includes a first pair of P-channel field effect transistors (PFETs) 102, 104, and a parallel second pair of P-channel field effect transistors (PFETs) 106, 108, each having a source connected to the variable voltage rail VDD. A pair of resistors 109, 110 is connected in series between differential outputs OUTN, OUTP of the I/O circuit 100. Resistors 109, 110 are equal value devices forming a voltage divider to provide a control BIAS signal. A constant gate bias input BIAS is applied to a gate of PFETS 104, 106 that are always on. A selectively enabled gate bias input BIASP2 is applied to a gate of PFETs 102, 108.

I/O circuit 100 includes a differential stage formed by a plurality of N-channel field effect transistors (NFETs) 112, 114, 116, 118. A respective gate input PADR, PADRN is applied to a gate of NFETs 112, 114. The constant gate bias input BIAS is applied to a gate of NFET 116 that is always on. A selectively enabled gate bias input BIASN2 is applied to a gate of NFET 118. I/O circuit 100 includes a pair of P-channel field effect transistors (PFETs) 120, 122. PFET 120 is connected between a common drain connection of PFETs 102, 104 and the output OUTN. PFET 122 is connected between a common drain connection of PFETs 106, 108 and the output OUTP.

Referring also to FIG. 2, I/O circuit 100 includes a pair of N-channel field effect transistors (NFETs) 130, 132. NFET 130 is connected between the output OUTN and a common drain connection of a pair of NFETs 134, 136. NFET 132 is connected between the output OUTP and a common drain connection of a parallel second pair of NFETs 138, 140. The constant gate bias input BIAS is applied to a respective gate of NFETs 136, 138. The selectively enabled gate bias input BIASN2 is applied to a respective gate of NFETs 134, 140.

Devices PFETs 104, 106, NFET 116 of FIG. 1 and NFETs 136, 138, and PFET 144 of FIG. 2 of the I/O circuit 100 are the basic current biasing devices. PFETs 104, 106, NFET 116 of FIG. 1 and NFETs 136, 138, and PFET 144 of FIG. 2 of the I/O circuit 100 are always on and are controlled by the constant gate bias input signal BIAS.

When the power supply voltage is reduced, BIASP2 and BIASN2 are connected to BIAS creating additional bias current to maintain performance. The second set of current biasing devices including PFETs 102, 108, NFET 118 of FIG. 1 and NFETs 134, 140, and PFET 146 of FIG. 2 of the I/O circuit 100 are turned on by BIASP2 and BIASN2 being connected to BIAS. An exemplary bias control generating circuit for connecting BIASP2 and BIASN2 to BIAS when the power supply voltage is reduced is illustrated and described with respect to FIG. 3. A ratio of the first set or basic current biasing devices and the second set of current biasing devices can be set to maintain constant current for two power supplies.

Figure 3:
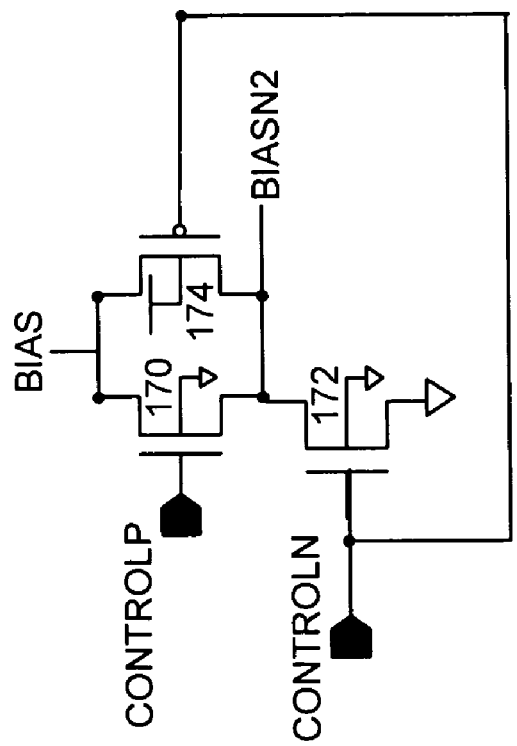
FIG. 3 is a schematic diagram of an exemplary bias control generating circuit for use with the I/O circuit of FIGS. 1 and 2 in accordance with the preferred embodiment.
Figure 3:
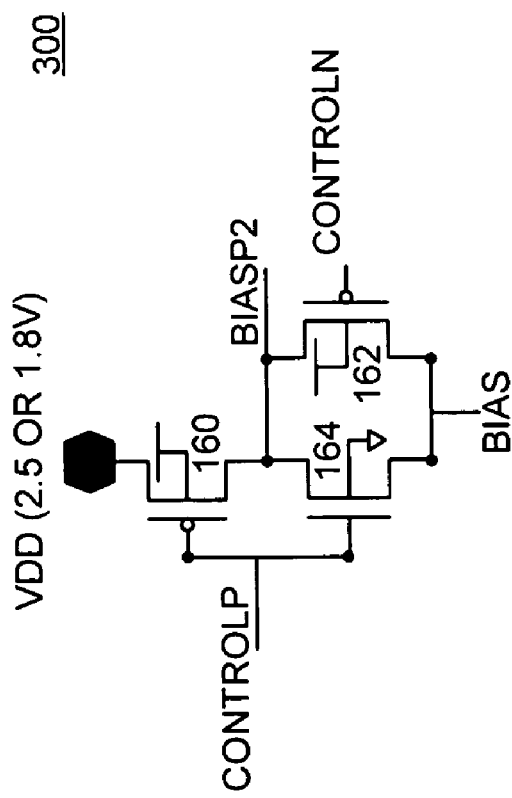

Referring also to FIG. 3, there is shown an exemplary bias control generating circuit generally designated by the reference character 300 for use with the I/O circuit 100 in accordance with the preferred embodiment.

In accordance with features of the preferred embodiment, BIASP2 and BIASN2 are connected to BIAS by the bias control generating circuit 300 when the power supply voltage is reduced to the lower voltage or 1.8V. When the power supply voltage is increased to the higher voltage or 2.5 V, then BIASP2 and BIASN2 are disabled by the bias control generating circuit 300.

Bias control generating circuit 300 includes a pair of PFETs 160, 162 and an NFET 164. A source of PFET 160 is connected to the voltage supply rail of 2.5 V or 1.8V. A common drain connection of PFET 160 and NFET 164 is provided at node BIASP2. A source of PFET 162 is connected to the common drain connection of PFET 160 and NFET 164 at node BIASP2. A source of NFET 164 and a drain of PFET 162 are connected to BIAS. A gate input CONTROLP is applied to a gate of PFET 160 and NFET 164. A gate input CONTROLN is applied to a gate of NFET 162.

PFETs 160, 162 and NFET 164 are arranged for generating BIASP2 connected to BIAS when the power supply voltage is reduced to the lower voltage or 1.8V.

Bias control generating circuit 300 includes a pair of NFETs 170, 172 and a PFET 174 for selectively connecting BIASN2 to BIAS when the power supply voltage is reduced to the lower voltage or 1.8V. A source of PFET 174 and a drain of NFET 170 are connected to BIAS. A drain of PFET 174 and a source of NFET 170 are connected together at node BIASN2 and are connected to a drain of NFET 172. The source of NFET 172 is connected to ground potential. A gate input CONTROLN is applied to a gate of PFET 174 and NFET 172. A gate input CONTROLP is applied to a gate of NFET 170.

NFETs 170, 172 and PFET 174 are arranged for generating BIASN2 connected to BIAS when the power supply voltage is reduced to the lower voltage or 1.8V.

It should be understood that the present invention is not limited to the illustrated arrangement. For example, it should be understood that the present invention could be extended for more than two power supply values by adding additional parallel devices.

While the present invention has been described with reference to the details of the embodiments of the invention shown in the drawing, these details are not intended to limit the scope of the invention as claimed in the appended claims.

What is claimed is:

1. A method for implementing power control in multi-voltage input/output (I/O) circuits comprising the steps of:
providing first current biasing devices for creating a first constant bias current;
providing second current biasing devices for creating a second bias current; and
activating said second current biasing devices at a first voltage; and deactivating said second current biasing devices at a second voltage; said first voltage being less than said second voltage.

2. A method for implementing power control as recited in claim 1 wherein the step of providing said first current biasing devices for creating said first constant bias current includes the steps of constantly activating said first current biasing devices at both said first voltage and said second voltage.

3. A method for implementing power control as recited in claim 1 wherein the step of providing said second current biasing devices for creating said second bias current includes the steps of providing said second current biasing devices in parallel with said first current biasing devices; and applying a control input to said second current biasing devices for selectively activating said second current biasing devices at said first voltage; and deactivating said second current biasing devices at said second voltage.

4. A method for implementing power control as recited in claim 1 wherein each of the steps of providing said first current biasing devices and providing said second current biasing devices includes the steps of providing a plurality of field effect transistors (FETs).

5. A method for implementing power control as recited in claim 4 includes the steps of providing respective field effect transistors (FETs) of said second current biasing devices in parallel with respective field effect transistors (FETs) of said first current biasing devices.

6. A method for implementing power control as recited in claim 5 includes the steps of connecting a gate input of respective field effect transistors (FETs) of said first current biasing devices to a gate input of respective field effect transistors (FETs) of said second current biasing devices at said first voltage and disconnecting said gate inputs of respective field effect transistors (FETs) of said second current biasing devices at said second voltage.

7. A method for implementing power control as recited in claim 1 wherein the steps of activating said second current biasing devices at a first voltage; and deactivating said second current biasing devices at a second voltage includes the steps of providing a bias control generating circuit coupled to said second current biasing devices for activating said second current biasing devices at said first voltage; and deactivating said second current biasing devices at said second voltage.

8. A method for implementing power control as recited in claim 1 wherein the steps of activating said second current biasing devices at a first voltage; and deactivating said second current biasing devices at a second voltage includes the steps of providing a bias control generating circuit for generating a control input for activating said second current biasing devices at said first voltage; and generating said control input for deactivating said second current biasing devices at said second voltage.

9. A method for implementing power control as recited in claim 8 wherein said control input includes a gate input applied to respective field effect transistors (FETs) of said second current biasing devices.

10. Apparatus for implementing power control in multi-voltage input/output (I/O) circuits comprising:
a first set of current biasing devices for creating a first constant bias current;
a second set of current biasing devices for creating a second bias current; and a control input for activating said second set of current biasing devices at a first voltage; and for deactivating said second set of current biasing devices at a second voltage; said first voltage being less than said second voltage.

11. Apparatus for implementing power control as recited in claim 10 includes a bias control generating circuit for generating said control input.

12. Apparatus for implementing power control as recited in claim 10 wherein each of said first set of said current biasing devices and said second set of said current biasing devices includes a plurality of field effect transistors (FETs).

13. Apparatus for implementing power control as recited in claim 12 wherein said plurality of field effect transistors (FETs) of said first set of said current biasing devices are constantly activated and controlled by a constant gate input.

14. Apparatus for implementing power control as recited in claim 12 wherein said plurality of field effect transistors (FETs) of said second set of said current biasing devices are selectively activated at said first voltage and controlled by a switched gate input.

15. Apparatus for implementing power control as recited in claim 14 wherein said plurality of field effect transistors (FETs) of said second set of said current biasing devices are coupled to a bias control generating circuit providing said switched gate input and selectively activated at said first voltage.

* * * * *